(12) United States Patent
Anbuky et al.

(10) Patent No.: US 6,469,471 B1
(45) Date of Patent: Oct. 22, 2002

(54) BATTERY CHARGE MEASUREMENT AND DISCHARGE RESERVE TIME PREDICTION TECHNIQUE AND APPARATUS

(75) Inventors: Adnan H. Anbuky; Phillip E. Pascoe, both of Christchurch (NZ)

(73) Assignee: Invensys Energy Systems (NZ) Limited, Christchurch (NZ)

( * ) Notice: Subject to any disclaimer, the term of this patent is extended or adjusted under 35 U.S.C. 154(b) by 0 days.

(21) Appl. No.: 09/763,991

(22) PCT Filed: Aug. 27, 1999

(86) PCT No.: PCT/NZ99/00142

§ 371 (c)(1),
(2), (4) Date: Feb. 27, 2001

(87) PCT Pub. No.: WO00/13288

PCT Pub. Date: Mar. 9, 2000

(30) Foreign Application Priority Data

Aug. 28, 1998 (NZ) .............................................. 331638

(51) Int. Cl.[7] .................................................. H02J 7/00
(52) U.S. Cl. ....................................... 320/118; 320/116
(58) Field of Search ................................ 320/118, 116, 320/124, 125, 127, 128, 132, 134, 136, 137; 324/426, 427

(56) References Cited

U.S. PATENT DOCUMENTS

| 4,876,513 A | | 10/1989 | Brilmyer et al. ............. 320/136 |
| 4,952,862 A | * | 8/1990 | Biagetti et al. .............. 320/132 |
| 5,371,682 A | * | 12/1994 | Levine et al. ................ 324/426 |
| 5,587,660 A | | 12/1996 | Chabbert et al. ............ 324/426 |
| 5,587,924 A | | 12/1996 | Rossi ........................... 320/106 |
| 5,808,445 A | * | 9/1998 | Aylor et al. .................. 320/132 |
| 6,037,749 A | * | 3/2000 | Parsonage ................... 320/132 |

FOREIGN PATENT DOCUMENTS

| EP | 0 714 033 | 5/1996 |
| EP | 714033 | 5/1996 |
| FR | 2 734 061 | 11/1996 |
| WO | WO 96/15563 | 5/1996 |

OTHER PUBLICATIONS

"IEEE Recommended Practice for Maintenance, Testing, and Replacement of Valve–Regulated Lead–Acid (VRLA) Batteries for Stationary Applications," IEEE Std 1188–1996, 16 pages.

Markle, Gary J., "AC Impedance Testing for Valve Regulated Cell," INTELEC 1992, 9–4, pp. 212–217.

(List continued on next page.)

*Primary Examiner*—Edward H. Tso
*Assistant Examiner*—Lawrence Luk
(74) *Attorney, Agent, or Firm*—Myers Bigel Sibley & Sajovec

(57) ABSTRACT

A method of testing one or more cells and parameterising the results in order to obtain a characteristic curve/function from which cell discharge reserve time can be predicted from cell voltage. The test involves obtaining a plurality of data points representing the voltage of a cell as a function of charge remaining, and parameterising the data points to obtain a function representing cell voltage and charge remaining. The function allows charge remaining to be calculated from cell voltage. The invention also provides for a device for measuring capacity and predicting discharge reserve time of a cell, the device including a voltage and current measuring means adapted to measure the voltage and load current of a cell. The device also includes a timing means so that a number of voltage and current data points can be obtained with respect of time. The data points are parameterised and the device produces a function relating charge remaining to cell voltage whereby the charge remaining can be determined by measuring the cell voltage.

38 Claims, 10 Drawing Sheets

OTHER PUBLICATIONS

Troy et al., "Midpoint Conductance Technology Used in Telecommunication Stationary Standby Battery Applications, Part VI, Considerations for Deployment of Midpoint Conductance in Telecommunications Power Applications," INTELEC 1997, 29–4, pp. 695–702.

Kurisawa et al., "Internal Resistance and Deterioration of VRLA Battery Analysis of Internal Resistance Obtained by Direct Current Measurement and its Application to VRLA Battery Monitoring Technique," INTELEC 1997, 29–3, pp. 687–694.

Alber et al., "Impedance Testing—Is it a Substitute for Capacity Testing," INTELEC 1994, 10–1, pp. 245–249.

Yamamoto et al., "Deterioration Estimation Method for 200–Ah Sealed Lead–Acid Batteries," NTT Review, vol. 7, No. 4, Jul. 1995, pp. 65–69.

Cun et al., "The Experience of a UPS Company in Advanced Battery Monitoring," INTELEC 1996, 22–5, pp. 646–653.

Ng et al., "Evaluation of a Reverse Time Prediction Algorithm for Lead Acid Battery," INTELEC 1996, pp. 616–623.

Kurisawa et al., "Capacity Estimating Method of Lead–Acid Battery by Short–time Discharge," INTELEC 1997, pp. 483–490.

Supplementary European Search Report, EP 99 94 0753, Jun. 25, 2002.

* cited by examiner

BATTERY CHARGE MEASUREMENT AND DISCHARGE RESERVE TIME PREDICTION TECHNIQUE AND APPARATUS

FIELD OF THE INVENTION

The present invention relates to methods and apparatus for predicting and gauging the depth of available energy in a battery or electrochemical cell system. More particularly, although not exclusively, the present invention relates to methods and apparatus for measuring battery capacity, charge remaining and reserve time.

BACKGROUND TO THE INVENTION

It has long been recognised that battery or cell capacity depends on a number of factors. These include the batteries composition, geometry, discharge rate (i.e. load current), age, environmental temperature, end voltage, service history (i.e. characteristics of the batteries last charge), discharge depth and time on float. The available capacity of a battery can be represented as a complex, non-linear function of these parameters. The direct measurement of a number of these parameters to determine battery capacity is either impractical or financially prohibitive. One of the most well known techniques for measuring the capacity of a battery is known as a "discharge test" (IEEE Std 1188-1996; "*IEEE Recommended Practice for Maintenance, Testing, and Replacement of Valve-Regulated Lead-Acid (VRLA) Batteries for Stationary Applications*"). This procedure involves the full discharge of a battery into a stable load. A major disadvantage of this approach is that, in the context of the batteries application (for example in a telecommunication system), the system being powered is vulnerable to power outages as the battery must be disconnected from the system during its complete discharge. Further disadvantages include the necessity for bulky external loads, the need for backup power supplies and the labour involved in setting up and supervising the testing procedure.

Other techniques for measuring the battery capacity use methods whereby parameters such as impedance, (Gary J. Markle, "AC Impedance Testing for Valve Regulated Cell," *INTELEC* 1992, 9-4), conductance, (Michael E. Troy et al, "Midpoint Conductance Technology Used in Telecommunication Stationary Standby Battery Applications. Part VI. Considerations for Deployment of Midpoint Conductance in Telecommunications Power Applications," *INTELEC* 1997, 29-4), or internal resistance (Isamu Kurisawa and Masashi Iwata, "Internal Resistance and Deterioration of VRLA Battery—Analysis of Internal Resistance Obtained by Direct Current Measurement and its Application to VRLA Battery Monitoring Technique," *INTELEC* 1997, 29-3: Glenn Alber and Marco W. Migilaro, "Impedance Testing—s it a Substitute for Capacity Testing," *INTELEC* 1994, 10-1: Katsuhiko Yamamoto et al, "Deterioration Estimation Method for 200-Ah Sealed Lead-Acid Batteries," *NTT Review* Vol. 7, No. 4, July 1995) are correlated with a capacity. These latter methods generally employ a composite model based on a number of parameters. This model usually incorporates reference to cell resistance or impedance in determining the battery capacity (Jean Paul Cun et al, "The Experience of a UPS Company in Advanced Battery Monitoring," *INTELEC* 1996, 22-5: Petrick K. Ng et al, "Evaluation of a Reverse Time Prediction Algorithm for Lead Acid Battery", *INTELEC* 1996, 616-21). These methods have generally been developed for off-line applications and require the use of specialised equipment. Although they have had some success, it is generally considered in the art that these techniques are best suited for identifying gross faults (Michael E. Troy et al, "Midpoint Conductance Technology Used in Telecommunication Stationary Standby Battery Applications. Part VI. Considerations for Deployment of Midpoint Conductance in Telecommunications Power Applications," *INTELEC* 1997, 29-4: Katsuhiko Yamamoto et al, "*Deterioration Estimation Method for* 200-Ah Sealed Lead-Acid Batteries," *NTT Review* VoL. 7, No. 4, July 1995), tracking battery age and making battery life time predictions (Gary J. Markle, "AC Impedance Testing for Valve Regulated Cell," *INTELEC* 1992, 9-4: Katsuhiko Yamamoto et al, "Deterioration Estimation Method for 200-Ah Sealed Lead-Acid Batteries," *NTT Review* VoL. 7, No. 4, July 1995). A detailed short-term test of battery capacity measurement is still most effectively produced by the discharge test. Referring again to the latter models discussed above, such models used for on-line capacity measurements are often specific to particular cells and rely on measured parameters (Isamu Kurisawa and Masashi Iwata "Capacity Estimating Method of Lead-Acid Battery by Short- time Discharge", *INTELEC* 1997, 483–90). Such techniques are therefore susceptible to measurement errors. Further, the number of parameters necessary to classify an entire battery operation can become excessive making such approaches cumbersome and computationally complicated.

Alternative techniques for determining battery capacity have been proposed which are based on either open circuit voltage or charge accumulation (Minoru Kozaki, and Toshihiko Yamazaki, "Remaining Battery Capacity Meter and Method for Computing Remaining Capacity," U.S. Pat. No. 5,691,078, Nov. 25, 1997).

In the context of telecommunications applications, the open circuit method is undesirable. Disconnecting the battery string from the power supply system would leave the telecommunication system vulnerable to switch failure and hence accidental isolation of the string from the system. Further, the charge accumulation approach requires long term monitoring of the battery (or battery string) and is dependent on knowing an accurate initial value of the battery capacity. Any initial error would affect the results of the rest of the monitoring activity. For this reason, this latter approach is considered unreliable.

It is accordingly an object of the present invention to provide a method and apparatus which allows for an accurate measurement of a batteries charge remaining (within the constraints of the application to which the battery is to be put), which avoids or at least ameliorates a number of the above mentioned problems, or at least provides the public with a useful choice.

DISCLOSURE OF THE INVENTION

In one aspect, the present invention provides for a method of testing/characterising one or more cells including the steps of:

obtaining a plurality of data points representing the direct relationship between voltage and charge remaining during an initial discharge of one or more cells; and, parameterising the data points to obtain a function representing voltage and charge remaining, the function terminating at an end voltage corresponding substantially to a voltage level at which the cell(s) is/are considered to be exhausted, and whereby during a subsequent discharge the function allows the charge remaining to be estimated directly from the cell(s) voltage.

After the parameterisation there may be a further step of calculating the discharge reserve time. Preferably the discharge reserve time is calculated by dividing the charge remaining by either a constant power discharge rate or a constant current discharge rate.

Additionally there may be yet a further step whereby a fully charged cell or cells is subjected to a partial discharge, the charge released during the partial discharge being added to the charge remaining to obtain a measurement of capacity.

Preferably the partial discharge is one that is long enough to avoid the Coup de Fouet region, but is much shorter than a complete discharge of the cell or cells.

The steps can correspond to measuring the cell(s) voltage and current over specific time intervals.

The parameterisation can be effected by means of collecting data points equidistant in the voltage domain, a least squares fit, interpolation and/or extrapolation, or an analytical approach adapted to target the best fit to the data points.

A number of data points for a set level of measurement accuracy can be obtained and parameterised.

Preferably the data points are selected over intervals selected so as to minimise the errors inherent in the parameterisation process.

Preferably any or all of the steps may be repeated due to changes in cell characteristic from ageing, environmental and usage conditions.

Preferably the decision to repeat the steps is determined by comparison of a state of change of the cell(s) derived from a previous test and the actual state of charge of the cell(s).

In a further aspect, the invention provides for a battery charge remaining and capacity measurement and discharge reserve time prediction device including:
- a voltage measurement means adapted to measure the voltage of a cell or cells;
- a current measurement means adapted to measure the present load on the cell or cells;
- a timing means adapted so that a substantially simultaneous measurement of voltage, current and time in respect of the cell or cells can be performed, thereby allowing the collection of a plurality of data points relating to the direct relation between cell voltage and charge remaining; and
- a processing means adapted to produce a curve/function directly relating charge remaining to cell voltage during an initial discharge of one or more cells, the curve/function terminating at an end voltage corresponding substantially to a voltage level at which the cell(s) is/are considered to be exhausted, and whereby during a subsequent discharge the curve/function allows the processing means to estimate charge remaining directly from the cell(s) voltage.

The device can include a microprocessor adapted to manipulate the voltage, time and current to provide data points representing the voltage as a function of charge remaining wherein the charge remaining is expressed in amp/hours.

The device can be adapted to calculate the discharge rate of a cell or cells, the device using the charge remaining and a discharge rate to determine the discharge reserve time. Preferably the discharge rate is calculated for either constant power or constant current discharge, and the discharge reserve time is expressed in hours and fractions of an hour.

The device can include a discharge means, the discharge means being adapted to at least partially discharge a cell or cells and measure the charge released from said cell or cells during the discharge, the cell or cells capacity being derived from the charge released during the discharge and the charge remaining.

The device may incorporate an output means adapted to graphically, numerically or otherwise indicate, in real time, the charge remaining, capacity measurement and/or discharge reserve time of the cell or cells being measured.

Preferably the device includes a means adapted to, at the initiation of a user, measure the data points and effect a parameterisation automatically.

The device can be further adapted to incorporated means for sensing variations in the environmental conditions in which the cell or cells are used and be further adapted so that in response to predetermined criteria, the device remeasures the data points and establishes an updated parameterisation.

Preferably the device may output the charge remaining, capacity measurement and/or discharge reserve time of the cell or cells constantly.

Alternatively the charge remaining, capacity measurement and/or discharge reserve time may be output in response to a user activation or request.

BRIEF DESCRIPTION OF THE DRAWINGS

The present invention will now be described by way of example and with reference to the Figures in which.

As a preliminary point, the following description will be given primarily in the context of telecommunications power supply systems. This is not to be construed as a limitation as there exist other applications to which the present invention is suited. These will be discussed in more details below.

Generally environmental parameters of telecommunication systems are controlled within specified limits. Given these limits, the minimum bus voltage should protect the system from being driven into undervoltage and provide at least the minimum voltage at which the telecommunication system will operate.

In the context of a digital telecommunication system these requirements translate into an acceptable load current variation of ±5%. Wider load variations are anticipated in analogue systems. A further factor which defines the degree of accuracy required in the measurement of battery charge remaining, is that most telecommunication sites are located in air conditioned environments which are kept at an optimal temperature.

To best illustrate the invention, various data are discussed below with reference to the method and apparatus of the invention. The data shown in FIGS. 3 to 8 were collected with a test circuit as illustrated in FIG. 1.

Figure 1:
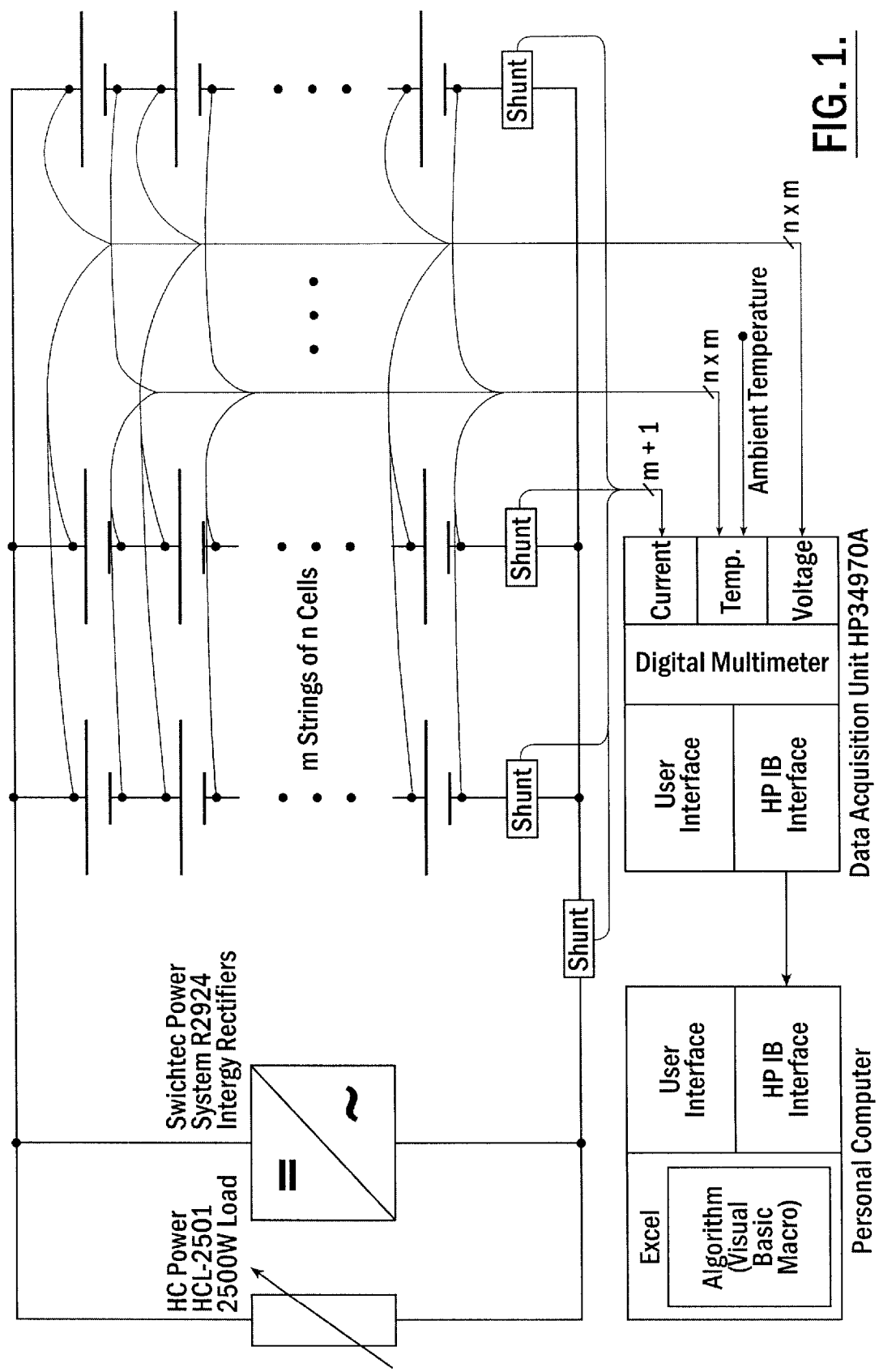
FIG. 1: illustrates schematically a testing arrangement for strings of cells.

Referring to FIG. 1, the batteries were charged using a power system consisting of three 24V, 120 A rectifier modules. The cells were discharged using a 2500 W electronic load. The battery data were acquired using a high-resolution data acquisition unit. Although not representative of a practical implementation of the present invention, this schematic circuit serves to illustrate and support the following description.

The circuit shown in FIG. 1 was used to acquire discharge rates, temperatures and voltages. The data thus obtained was analyzed on a personal computer using an appropriate user interface. To gauge the variation and predictability of the method of the present invention at different temperatures, the test system was contained inside an environmental chamber.

The discharge rate was measured using a calibrated 150 A, 75 mV current shunt. The test system exhibited a current resolution of better than 1 mA and a voltage resolution of better than 1 mV at an acquisition frequency of up to 1 Hz. It was found that a sampling rate of 12 seconds was sufficient to cover most of the key features involved in the analysis of this data.

As noted above, it is known to monitor battery discharge behavior by looking at the discharge voltage/time characteristics of a cell. Such a characteristic curve would only represent a single operating condition which is specific to that particular discharge regime. Therefore, using such a characteristic curve to perform charge remaining calculations would require a number of adjustment factors to allow for changes in parameters such as temperature, discharge rate, cell type etc. It is known to supply correction factors for these parameters. However, these are only average estimated values and may not be sufficiently accurate for effective measurement.

According to the present invention, it has been found that replacing the discharge voltage/time characteristic with discharge voltage/charge remaining characteristic renders the characteristic curve less vulnerable to parameter changes such as those noted above.

Figure 2:
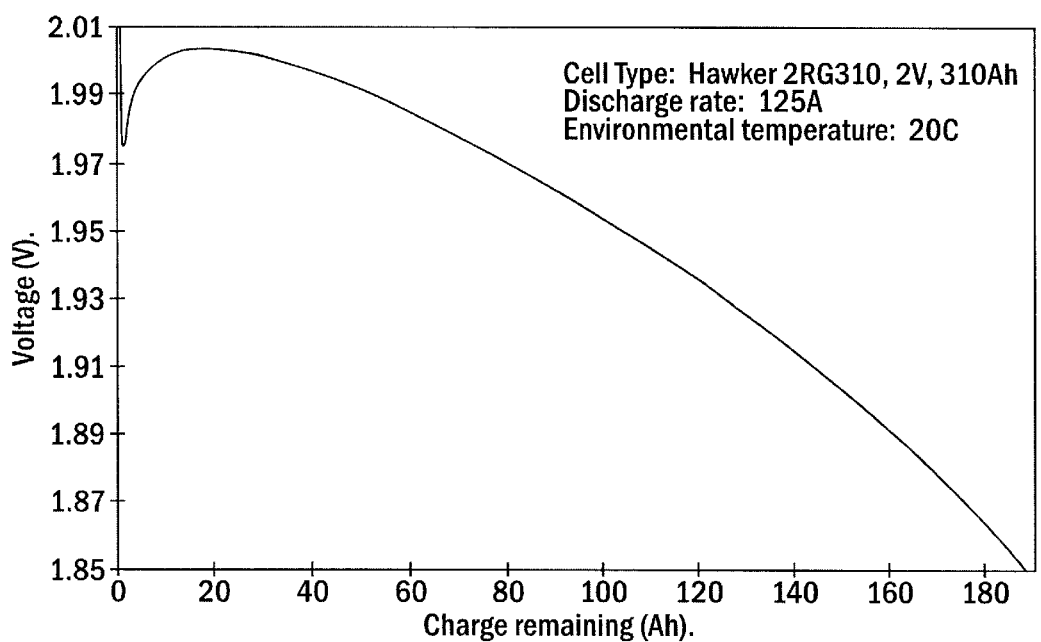
FIG. 2: illustrates a curve representing the charge remaining domain discharge characteristic.

FIG. 2 illustrates a discharge voltage characteristic as a function of the charge remaining where charge remaining is measured in Ah (ampere-hours).

With reference to FIG. 2, the end voltage has been identified with zero charge remaining. The selection of this condition is governed by the requirements of telecommunication systems in general. However, it is possible that a different end voltage may be used depending on the particular application of the invention.

Tying the discharge voltage/charge remaining characteristic curve to an end voltage results in the discharge curves being repeatable and follow a similar linear trend within a fairly narrow tolerance. This technique provides for a high degree of predictability of the charge remaining using the discharge voltage.

The following discussion will illustrate the sensitivity of this characteristic to a number of the primary battery operating parameters, being temperature, discharge rate and battery type.

The discharge test results illustrated in FIGS. 3 to 9 were obtained from tests on Hawker Energy 2RG310 2V, 310 Ah cells which were four years old. Unless otherwise indicated, the environmental temperature was 20° C. and the discharge rate used was C/3 or 100 A.

Figure 3A:
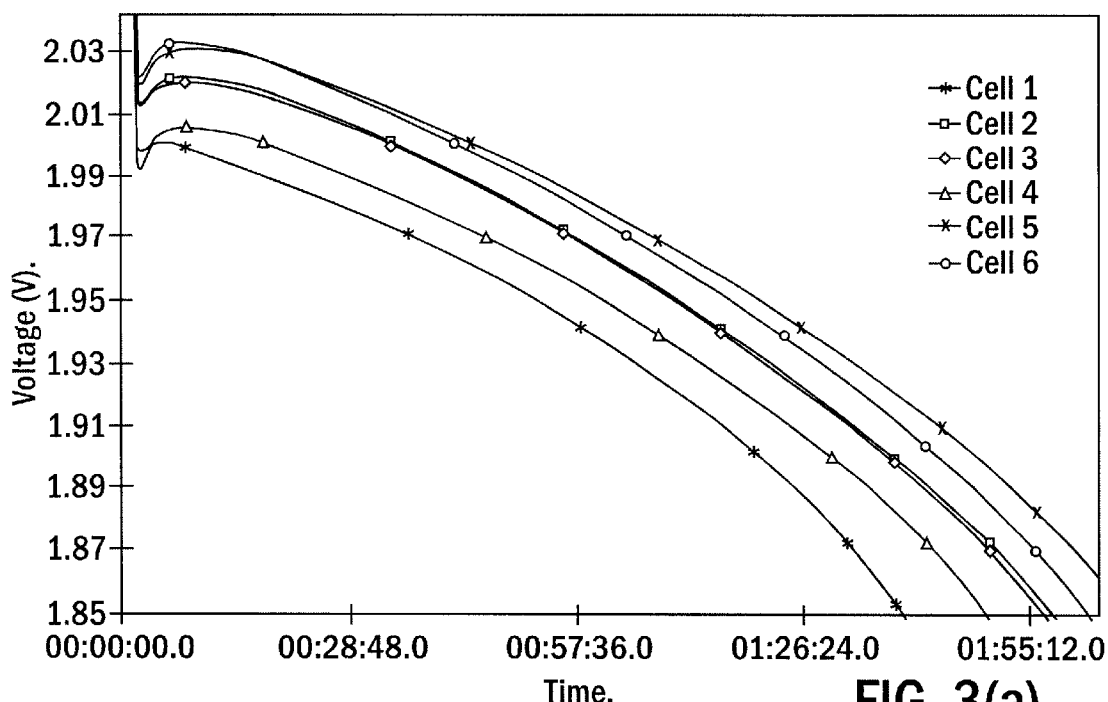
FIGS. 3a and b: illustrate time and charge remaining domain discharge characteristics of six different cells of the same type.
Figure 3B:
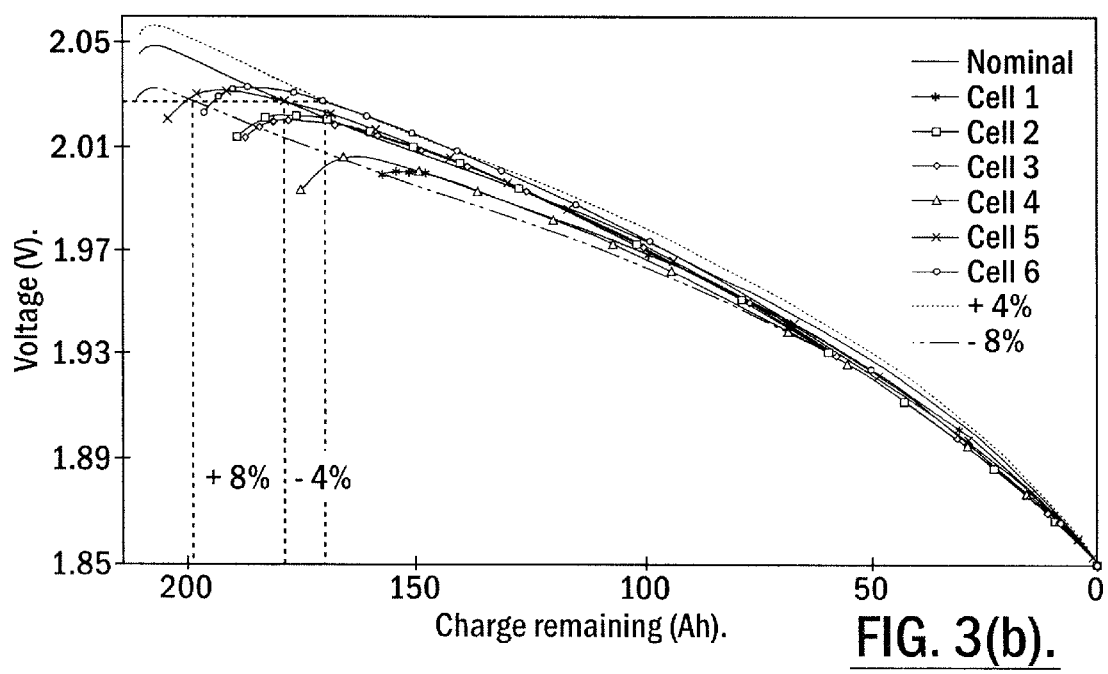
Figure 4A:
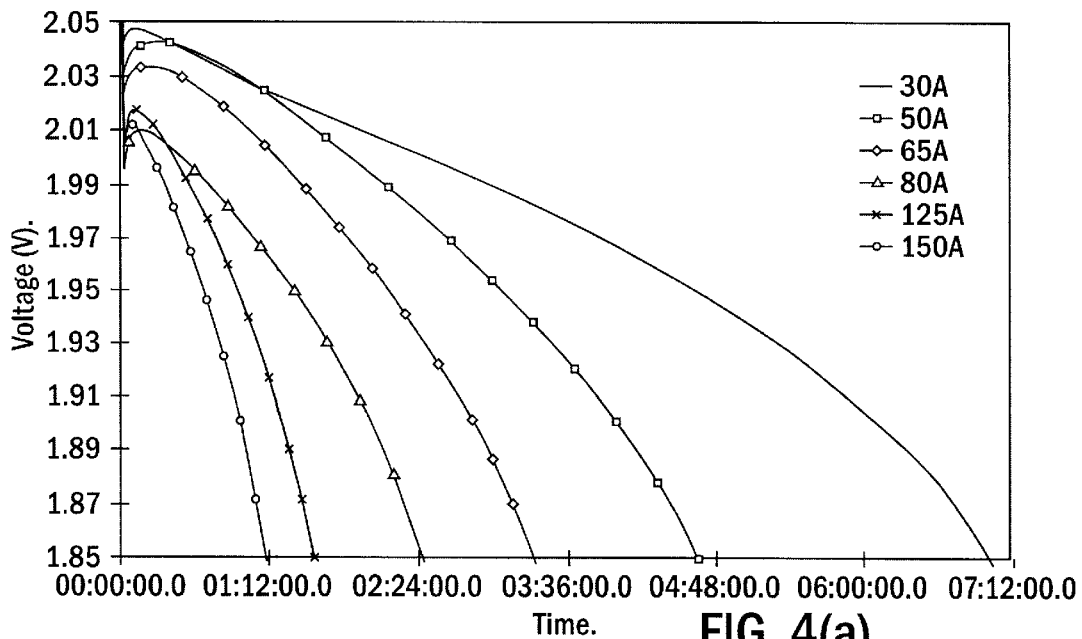
FIGS. 4a and b: illustrate time and charge remaining domain discharge characteristics of different cells of the same type at different discharge rates.
Figure 4B:
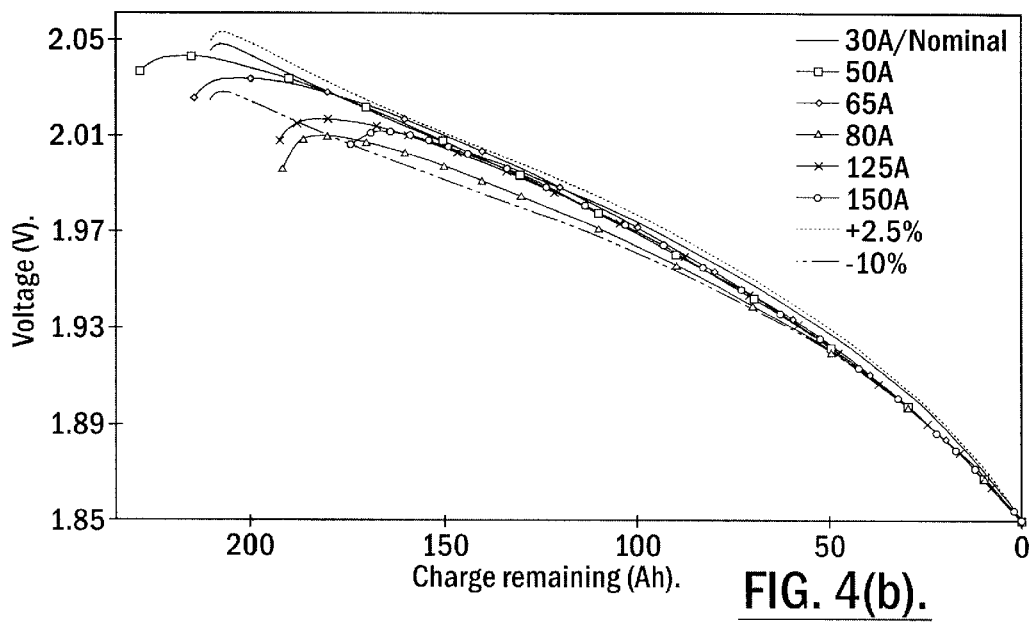

With reference to FIGS. 3a and 3b, six cells were fully charged and then discharged at a rate of C/3. The curves are compared to a nominal discharge curve that has been generated at a C/10 discharge rate. Different cells may exhibit different charge remaining reflecting the state of charge they retain. All the cells, however, show complete consistency with the nominal curve. As can been seen from FIG. 3a, the discharge curves exhibit an initial deviation which is due to the "Coup de Fouet region". Different discharge curves exhibit marginal deviations from each other. The deviation exhibited by the characteristic curves was found to be within a given tolerance band governed by the requirements of the particular application of these cells. As can be seen from FIG. 3b, transforming the characteristic curve to the charge remaining domain results in a tighter tolerance band compared to the time base characteristic (see FIG. 3a). FIGS. 4a and 4b illustrate the results of measuring discharge voltage versus charge remaining characteristic against different discharge rates. The rates selected were C/10, C/6, C/4, C/4, C/2.5 and C/2. Time based (i.e. prior art) and charge remaining based representations are shown. FIG. 4b illustrates that all of the discharge curves obtained in accordance with the invention are bounded within the specified tolerance band.

Figure 5A:
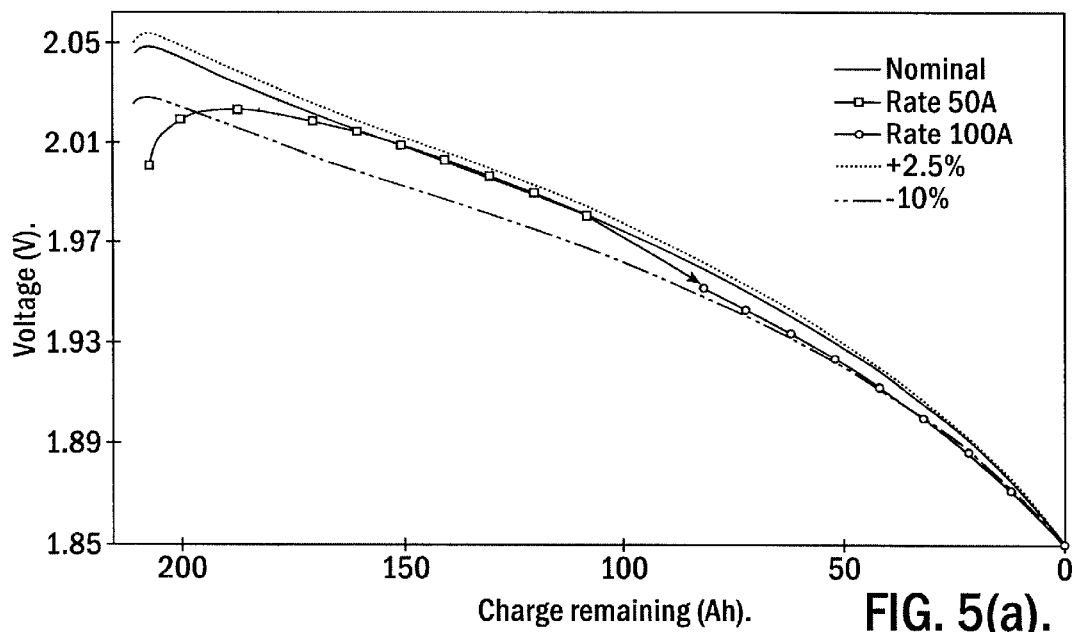
FIGS. 5a and b: illustrate the effects of discharge rate switching during the discharge.
Figure 5B:
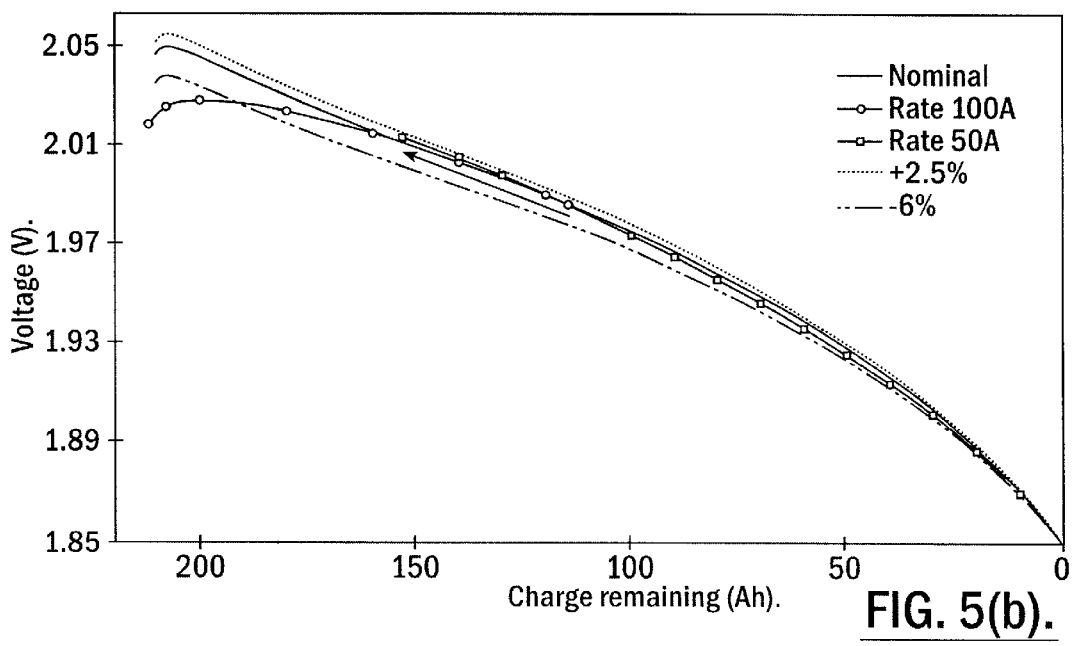

FIG. 5 illustrates the effect of changing the discharge rate during discharge. Switching the discharge rate from high to low causes the cell to release more charge and hence to jump back along the nominal discharge curve (see the arrow in FIG. 5b). Alternatively, switching from a low rate to a high rate (see the arrow in FIG. 5a) reduces the charge remaining. This causes the trend of the cell to jump forward along the nominal discharge curve. Both of these examples exhibit consistency in following the nominal discharge curve in spite of changes in charge remaining caused by variations in the discharge rate.

Figure 6A:
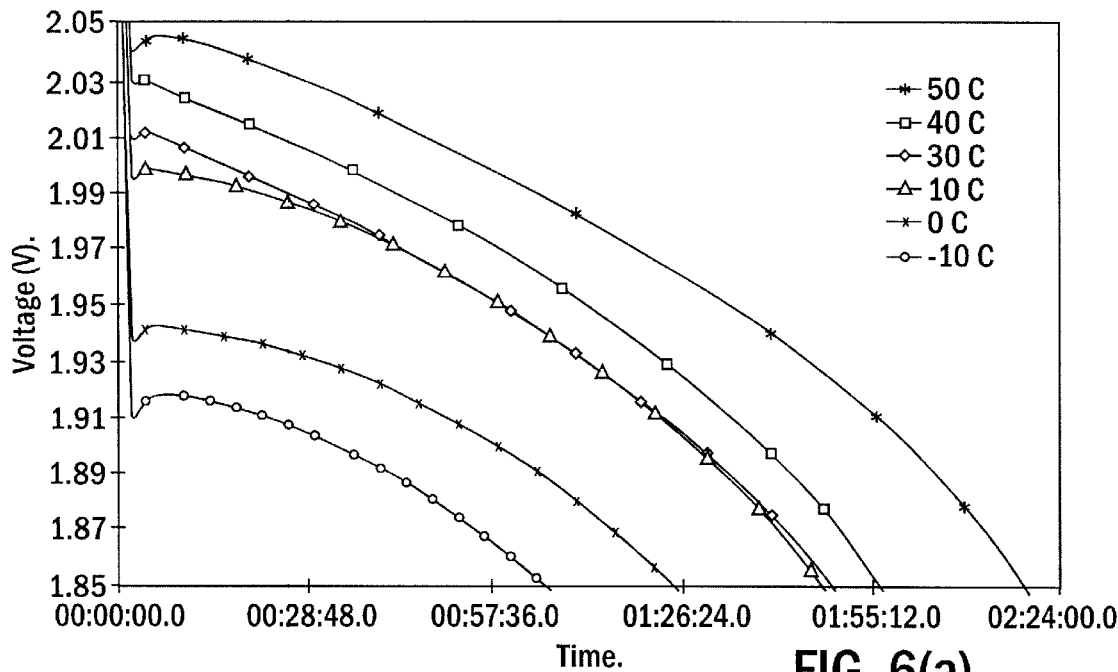
FIGS. 6a and b: illustrate time and charge remaining domain discharge characteristics of six different cells of the same type at different temperatures.
Figure 6B:
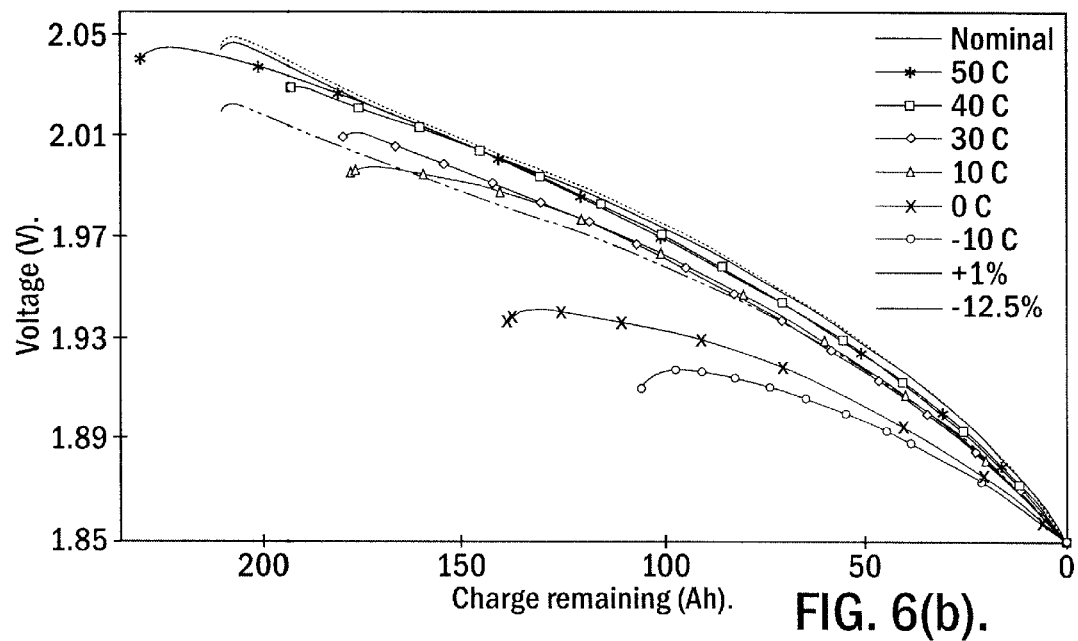

FIGS. 6a and 6b illustrate the results in testing the discharge voltage versus charge remaining at a number of different temperatures. Given that most telecommunication installations incorporate air-conditioned environments which are set at between 15 and 25° C., the characteristic curves obtained according to the invention for such a temperature band fall within the required tolerances.

Figure 7A:
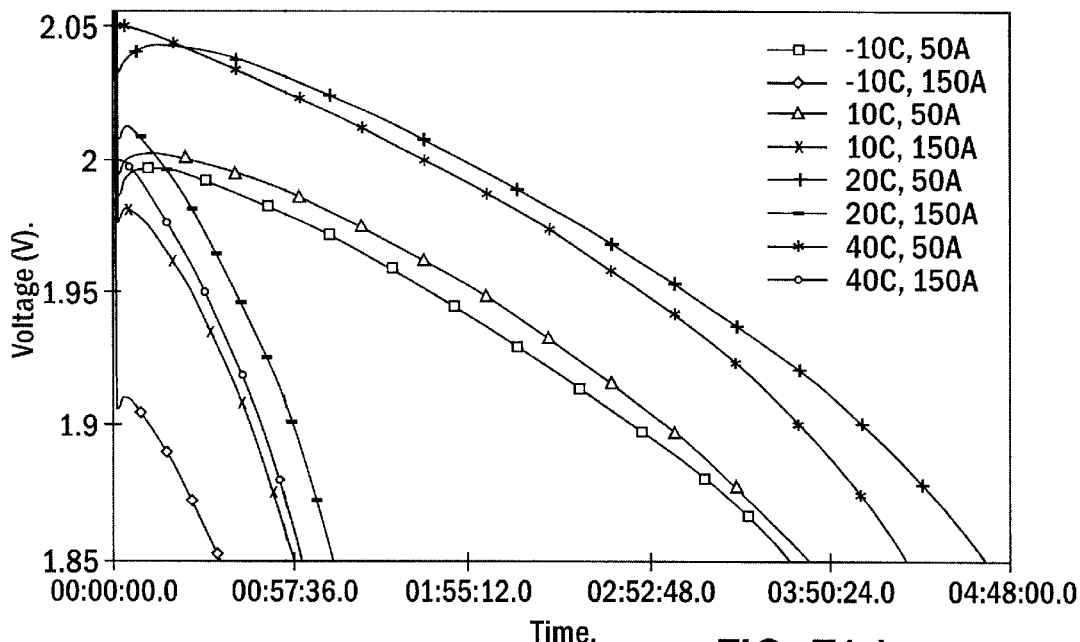
FIGS. 7a and b: illustrate time and charge remaining domain discharge characteristics of eight different cells of the same type with different discharge rate and temperature combinations.
Figure 7B:
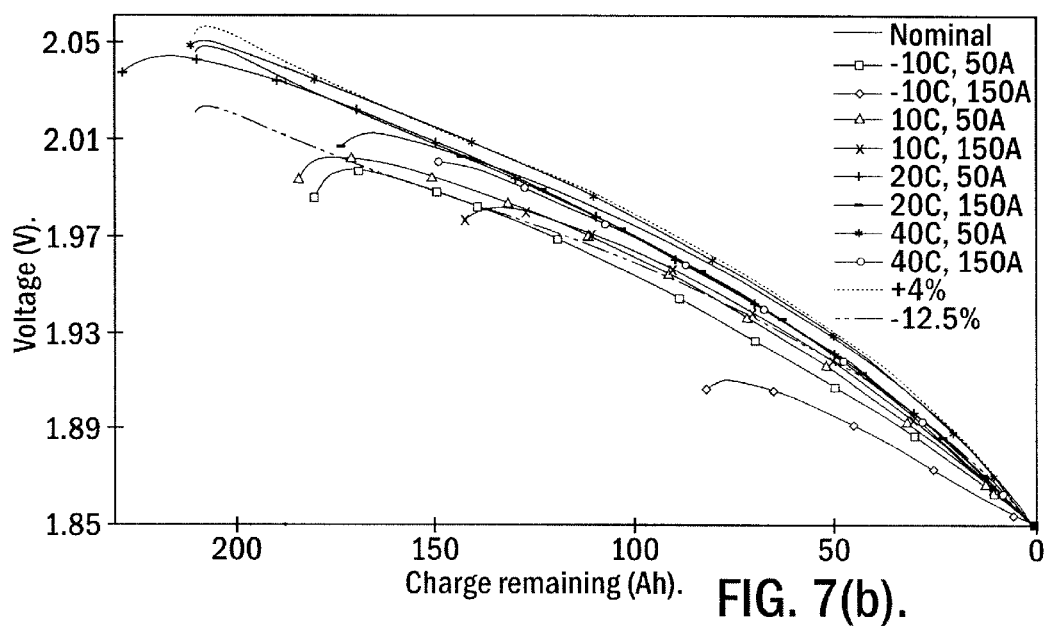

FIGS. 7a and 7b illustrate test results relating the discharge voltage to the charge remaining for variations in both discharge rate and temperature. This test is aimed at verifying the robustness of the relationship for multiple parameter variations. Referring to FIG. 7b, it can be seen that the majority of the discharge curves are consistent with the nominal discharge curve within the required tolerance range.

Figure 8A:
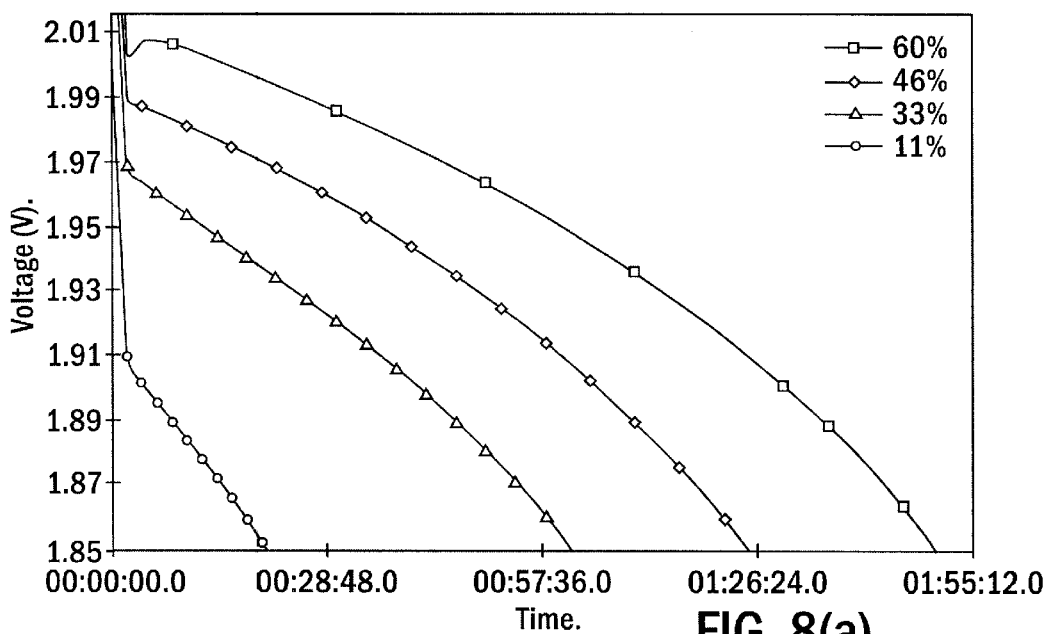
FIGS. 8a and b: illustrate time and charge remaining domain discharge characteristics of four different cells of the same type with different charge levels.
Figure 8B:
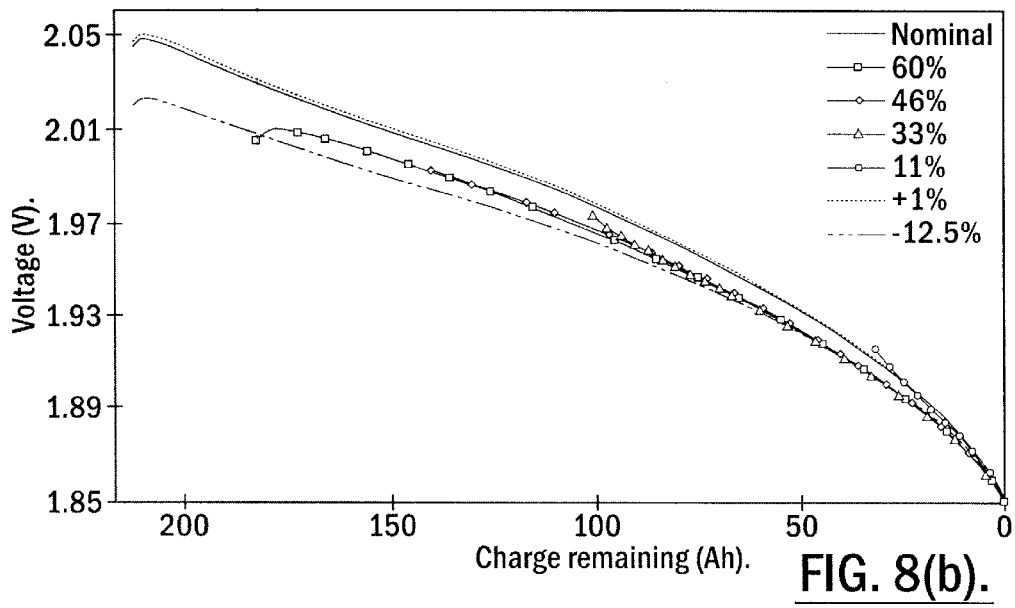

Finally, FIGS. 8a and 8b illustrate the results of the discharge of four cells with different initial levels of charge remaining. The cells are discharged to different depths and then left to settle for one hour. After that time, the cell is discharged to the end voltage. The four cells therefore contain different charge remaining at the start of their discharge. FIG. 8a illustrates the discharge characteristic in the time domain. The discharge characteristics in the charge remaining domain are shown in FIG. 8b. The results illustrate a good degree of consistency in following the trend of the nominal discharge curve within the specified tolerance band.

As can be seen from the results shown in FIGS. 3 to 8, it has been found that there is a robust relationship between the battery discharge voltage and the charge remaining. By treating the battery or cell as essentially a "black box", a characterising curve may be utilised for measuring battery charge remaining during its discharge.

The technique may be implemented by representing the characteristic curve by a table of discharge voltage/charge remaining data. During discharge of the cell, this data is utilised to calculate the charge remaining at each discharge voltage or continuously by means of a real time determination.

Figure 9:
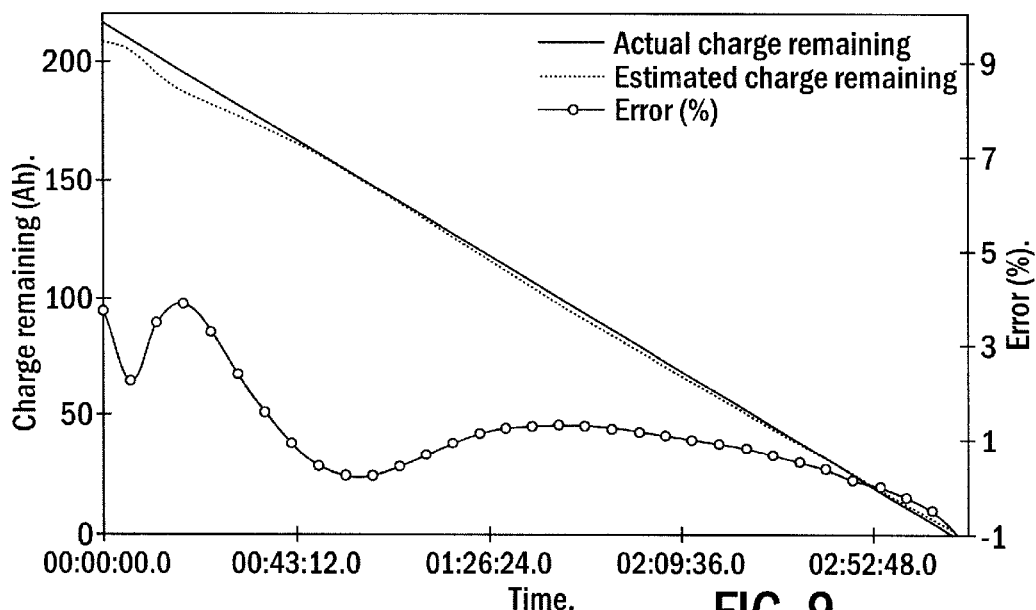
FIG. 9: illustrates actual and measured charge remaining and measurement error for a new forty-eight volt string of cells discharged at a rate of 68 amps.

To implement the technique practically, a number of measurements of discharge voltage versus charge remaining are made. These data are then parameterised in the form of a curve whereby for any given discharge voltage, a charge remaining value can be derived from the curve. Generally, the charge remaining values are given as percentages related to the rated cell capacity. As an example, measurement of the charge remaining for a string of 24 Hawker Energy 2HI1275 2V cells is shown in FIG. 9. The results show a percentage error of less than 5% throughout the discharge of the cells. The quality of the results may be partially attributed to the consistency of new cells and partly due to the averaging effect of the string.

In implementing the present technique in a telecommunications power supply situation, it has been found that only six data points are necessary to provide the required degree of predictability within the tolerances defined by such applications. The selection of six data points to represent the discharge data represents a trade off between accuracy and data storage. This also satisfies the IEEE requirement for a minimum of five points to represent a discharge (IEEE Std 1188-1996; "IEEE Recommended Practice for Maintenance, Testing, and Replacement of Valve-Regulated Lead-Acid (VRLA) Batteries for Stationary Applications").

In addition, six data points were found to be an acceptable number of points for user actuated processes whereby a manual discharge table is generated by a user. This limitation was imposed as it was considered that increasing the number of data points could increase the chances of manual data entry errors. Once the six data points are obtained, a linear interpolation is used to derive the charge remaining. From this curve, charge remaining can be calculated for any arbitrary discharge voltage.

In a practical implementation, a device implementing the present invention may incorporate auto-discharge table generation functionality as well as manual table generation. The auto-discharge table generation facility would enable a user to update the battery characteristic table at a random or predefined time interval. The decision whether to re-characterise the battery may depend on the environmental conditions in which the battery is stored or changes in both the environmental conditions and the anticipated battery characteristic as the battery ages.

Figure 10:
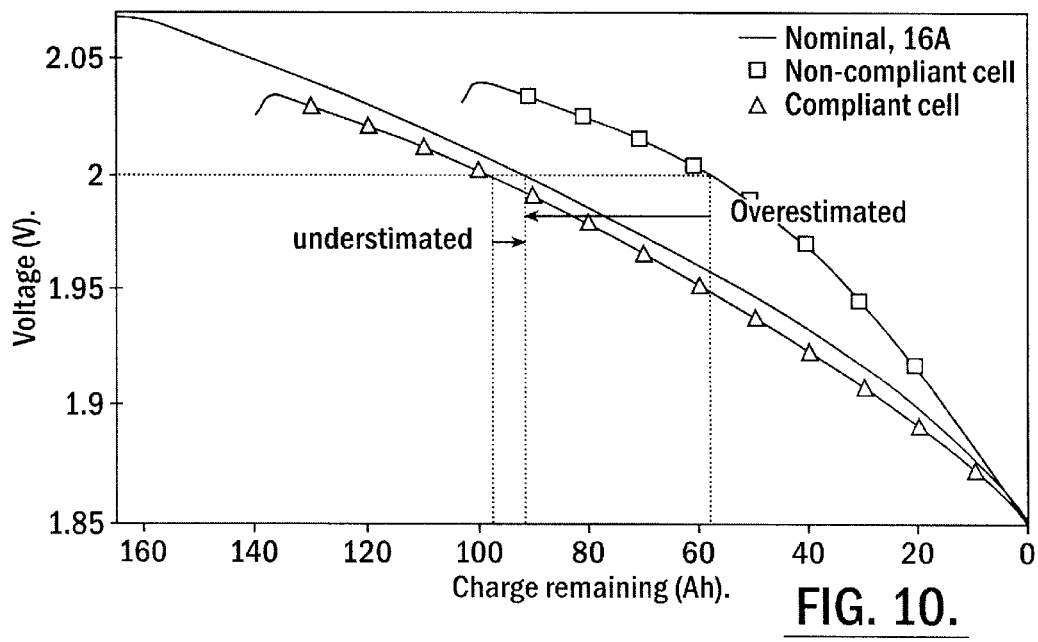
FIG. 10: illustrates the discharge characteristics of two cells, one complying and one not complying with the nominal characteristic.
Figure 11:
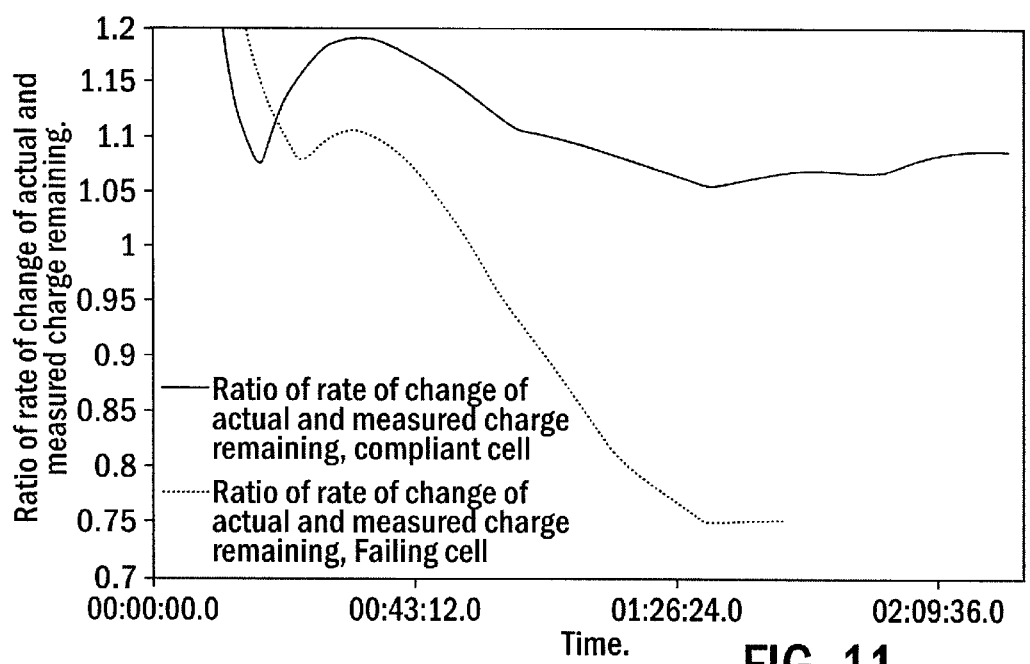
FIG. 11: illustrates the ratio of actual and measured charge remaining for the compliant and noncompliant cells shown in FIG. 10.

Even though a reliable measurement of the charge remaining can be gathered using the voltage, a drastic change in battery behavior may take place due to thermal stress or for some other operational reason. In this case a re-characterisation of the nominal discharge curve may be required. The need for re-characterisation can be raised through a crosscheck between the rate of change of measured charge remaining with the rate of change of actual charge remaining, which is equivalent to the rate of change of charge released. An example is given in FIGS. 10 and 11. FIG. 10 illustrates a nominal (16 A) discharge, and discharges of a complying and non-complying (both at 60 A) cell from within an Oldham 6RG180 mono-bloc. FIG. 11 illustrates the ratio of the rate of change of measured and actual charge remaining for the two 60 A discharges. Ideally these curves should be equal to unity throughout the discharge. However, the curve associated with the non-complying cell clearly diverges from unity, highlighting the necessity for re-characterisation. This technique of tracking the rate of change in measured charge remaining might also be used as an indicator for battery replacement or simply as an element to enable tuning of the charge remaining measurement method. The test for the need for re-characterisation could be conducted in a real time mode during any intentional or operational discharge.

Thus the present invention provides a highly robust method and apparatus for charge remaining measurement during battery discharge. It has been found that a measurement accuracy of better than 10% is obtained and this is within the constraints required by telecommunications applications. The invention has shown to be valid for different cells of the same type, different discharge rates, environmental temperatures and level of charge. An implementation of the present technique may use an automatic test for generating the required discharge table or alternatively this may be generated manually by means of user interaction.

Once a measurement of charge remaining has been made the discharge reserve time can be calculated. This is usually performed by dividing the charge remaining by the discharge rate and could be calculated for either constant power or constant current discharge. This results in a measurement of discharge reserve time in hours and fractions of an hour.

In addition to obtaining measurements of battery charge remaining this technique can be used to obtain measurements of battery capacity. This is performed by conducting a brief discharge of the fully charged battery and obtaining a measurement of the charge remaining, A brief discharge in this context is one which is long enough to avoid the Coup de Fouet region but which is much shorter than a complete discharge to the designated system end voltage. Once the measurement of the charge remaining is obtained it is added to that charge released during the brief discharge to obtain a measurement of the battery capacity.

It is envisaged that there exists other applications particularly suited for this battery monitoring technique. In particular, electric vehicles provide an ideal application as they routinely exhibit a large range of load currents and hence data over a wide part of the cells characteristic discharge curve can be obtained as the user is driving the electric vehicle. In such an application, a device according to the present invention would be analogous to a fuel gauge showing distance remaining at a specific speed and be constantly updateable according to measurements made as described above. Other applications of the present invention exist in general power supply contexts and these will be clear to one skilled in the art as would their implementation.

Referring to the implementation of the present invention, the data processing aspects of the present invention may be carried out in software. To this end, an additional advantage of the present invention is that the signal processing inputs are likely to be already existing in the power supply system. Therefore, the invention may be implemented easily without the addition of substantial hardware other than that associated with the display electronics or telemetry as may be required in the particular application.

Where in the aforegoing description reference has been made to elements or integers having known equivalents, then such equivalents are included as if they were individually set forth.

Although the invention has been described by way of example and with reference to particular embodiments, it is to be understood that modifications and/or improvements may be made without departing from the scope or spirit of the attached claims.

What is claimed is:

1. A method of calculating the discharge reserve time of one or more test cells including the steps of:
    obtaining a plurality of data points representing the direct relationship between voltage and charge remaining during an initial discharge of one or more nominal cells;
    parameterising the data points to obtain a function representing charge remaining as a function of a single voltage variable, the function terminating at an end voltage corresponding substantially to a voltage level at which the nominal cell(s) is/are considered to be exhausted;
    estimating charge remaining directly from the cell voltage of said test cell(s) during a discharge in accordance with said function; and
    calculating the discharge reserve time of said test cell(s) from said estimated charge remaining.

2. A method as claimed in claim 1 wherein said test cells are different from said nominal cells.

3. A method as claimed in claim 1 wherein the discharge reserve time is calculated by dividing the charge remaining by a constant power discharge rate.

4. A method as claimed in claim 1 wherein the discharge reserve time is calculated by dividing the charge remaining by a constant current discharge rate.

5. A method as claimed in claim 1 wherein a fully charged cell or cells is/are subjected to a partial discharge, the charge released during the partial discharge being added to the charge remaining to obtain a measurement of capacity.

6. A method as claimed in claim 1 wherein a fully charged cell or cells is/are subjected to a partial discharge, the charge released during the partial discharge being added to the charge remaining to obtain a meausrement of capacity, and wherein the partial discharge is one that is long enough to avoid the Coup de Fouet region, but is much shorter than a complete discharge of the cell or cells.

7. A method as claimed in claim 1 wherein the data points are obtained by measuring the cell(s) voltage and current over specific time intervals.

8. A method as claimed in claim 1 wherein the parameterisation is effected by means of collecting data points equidistant in the voltage domain, a least squares fit, interpolation, extrapolation, or an analytical approach adapted to target the best fit to the characteristics.

9. A method as claimed in claim 1 wherein a minimum number of data points sufficient for a set level of measurement accuracy are obtained and parameterised.

10. A method as claimed in claim 1 wherein the data points are selected over intervals selected so as to minimise the errors inherent in the parameterisation process.

11. A method as claimed claim 1 wherein the steps are repeated due to changes in cell characteristic from ageing, environmental and usage conditions.

12. A method as claimed in claim 1 wherein the steps are repeated due to changes in cell characteristics from aging, environmental and usage conditions, and wherein the decision to repeat the steps is determined by comparison of the change in charge remaining measured for a cell(s) derived from a previous characterisation and the change in actual charge remaining of the cell(s).

13. A battery charge remaining and capacity measurement and discharge reserve time prediction device including:
    a voltage measurement means adapted to measure the voltage of a cell or cells;
    a current measurement means adapted to measure the present load on the cell or cells;
    a timing means adapted so that a substantially simultaneous measurement of voltage, current and time in respect of the cell or cells can be performed, thereby allowing the collection of a plurality of data points relating to the direct relationship between cell voltage and charge remaining; and
    a processing means adapted to produce a curve/function relating charge remaining as a single-variable function of cell voltage during an initial discharge of one or more cells, the curve/function terminating at an end voltage corresponding substantially to a voltage level at which the cell(s) is/are considered to be exhausted, and whereby during a subsequent discharge the curve/function allows the processing means to estimate charge remaining directly from the cell(s) voltage; and
    wherein the device is adapted to calculate the discharge rate of a cell or cells, the device using the charge remaining and discharge rate to determine the discharge reserve time.

14. A device as claimed in claim 13 which includes a microprocessor adapted to manipulate the voltage, time and current to provide data points representing the charge remaining as a function of voltage, wherein the charge remaining is expressed in amp/hours.

15. A device as claimed in claim 13 adapted to calculate the discharge rate of a cell or cells, the device using the charge remaining and discharge rate to determine the discharge reserve time, wherein the discharge rate is calculated for either constant power or constant current discharge, and the discharge reserve time is expressed in hours and fractions of an hour.

16. A device as claimed in claim 13 which further includes a discharge means, the discharge means being adapted to at least partially discharge the cell or cells and measure the charge released from said cell or cells during the discharge, the cell or cells capacity being derived from the charge released during the discharge and the charge remaining.

17. A device as claimed in claim 13 which includes an output means adapted to graphically, numerically or otherwise indicate, in real time, the charge remaining, capacity measurement and/or discharge reserve time of the cell or cells being measured.

18. A device as claimed in claim 13 adapted to, at the initiation of a user, measure the data points and effect the parameterisation automatically.

19. A device as claimed in claim 13 further adapted to include a means for sensing variations in the environmental conditions in which the cell or cells are used and further adapted so that, in response to predetermined criteria, the device remeasures the data points and establishes an updated parameterisation.

20. A device as claimed in claim 13 wherein the device outputs the charge remaining, capacity measurement and/or discharge reserve time of the cell or cells constantly.

21. A device as claimed in claim 13 wherein the charge remaining, capacity measurement and/or discharge reserve time may be output in response to a user activation or request.

22. A method of characterising one or more test cells including the steps of:
   obtaining a plurality of data points representing a relationship between voltage and absolute charge remaining during an initial discharge of one or more nominal cells; and
   parameterising the data points to obtain a function representing absolute charge remaining as a function of a single voltage variable, the function terminating at an end voltage corresponding substantially to a voltage level at which the nominal cell(s) is/are considered to be exhausted, and whereby during a subsequent discharge the function allows the absolute charge remaining to be estimated from the cell(s) voltage.

23. A method as claimed in claim 22 wherein a fully charged cell or cells is/are subjected to a partial discharge, the charge released during the partial discharge being added to the charge remaining to obtain a measurement of capacity.

24. A method as claimed in claim 22 wherein a fully charged cell or cells is/are subjected to a partial discharge, the charge released during the partial discharge being added to the charge remaining to obtain a measurement of capacity wherein the partial discharge is one that is long enough to avoid the Coup de Fouet region, but is much shorter than a complete discharge of the cell or cells.

25. A method as claimed in claim 22 wherein the data points are obtained by measuring the cell(s) voltage and current over specific time intervals.

26. A method as claimed in claim 22 wherein the parameterisation is effected by means of collecting data points equidistant in the voltage domain, a least squares fit, interpolation, extrapolation, or an analytical approach adapted to target the best fit to the characteristics.

27. A method as claimed in claim 22 wherein a minimum number of data points sufficient for a set level of measurement accuracy are obtained and parameterized.

28. A method as claimed in claim 22 wherein the data points are selected over intervals selected so as to minimise the errors inherent in the parameterisation process.

29. A method as claimed in claim 22 wherein the steps are repeated due to changes in cell characteristic from ageing, environmental and usage conditions.

30. A method as claimed in claim 22 wherein the steps are repeated due to changes in cell characteristic from ageing, environmental and usage conditions, and wherein the decision to repeat the steps is determined by comparison of the change in charge remaining measured for a cell(s) derived from a previous characterisation and the change in actual charge remaining of the cell(s).

31. A battery charge remaining and capacity measurement and discharge reserve time prediction device including:
   a voltage measurement means adapted to measure the voltage of a cell or cells;
   a current measurement means adapted to measure the present load on the cell or cells;
   a timing means adapted so that a substantially simultaneous measurement of voltage, current and time in respect of the cell or cells can be performed, thereby allowing the collection of a plurality of data points relating to the direct relationship between cell voltage and charge remaining; and
   a processing means adapted to produce a curve/function relating absolute charge remaining as a single-variable function of cell voltage during an initial discharge of one or more cells, the curve/function terminating at an end voltage corresponding substantially to a voltage level at which the cell(s) is/are considered to be exhausted, and whereby during a subsequent discharge the curve/function allows the processing means to estimate absolute charge remaining directly from the cell(s) voltage.

32. A device as claimed in claim 31 which includes a microprocessor adapted to manipulate the voltage, time and current to provide data points representing the charge remaining as a function of voltage, wherein the charge remaining is expressed in amp/hours.

33. A device as claimed in claim 31 which further includes a discharge means, the discharge means being adapted to at least partially discharge the cell or cells and measure the charge released from said cell or cells during the discharge, the cell or cells capacity being derived from the charge released during the discharge and the charge remaining.

34. A device as claimed in claim 31 which includes an output means adapted to graphically, numerically or otherwise indicate, in real time, the charge remaining, capacity measurement and/or discharge reserve time of the cell or cells being measured.

35. A device as claimed in claim 31, adapted to, at the initiation of a user, measure the data points and effect the parameterisation automatically.

36. A device as claimed in claim 31 further adapted to include a means for sensing variations in the environmental conditions in which the cell or cells are used and further adapted so that, in response to predetermined criteria, the device remeasures the data points and establishes an updated parameterisation.

37. A device as claimed in claim 31 wherein the device outputs the charge remaining, capacity measurement and/or discharge reserve time of the cell or cells constantly.

38. A device as claimed in claim 31 wherein the charge remaining, capacity measurement and/or discharge reserve time may be output in response to a user activation or request.

* * * * *